(12) United States Patent
Chu (10) Patent No.: US 11,659,678 B2
(45) Date of Patent: May 23, 2023

(54) SYSTEMS AND METHODS FOR REMOVING MODULES FROM AN INFORMATION HANDLING SYSTEM

(71) Applicant: Dell Products L.P., Round Rock, TX (US)

(72) Inventor: Yi-Pai Chu, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 472 days.

(21) Appl. No.: 16/983,193

(22) Filed: Aug. 3, 2020

(65) Prior Publication Data

US 2022/0039283 A1 Feb. 3, 2022

(51) Int. Cl.
*H05K 7/14* (2006.01)
*H05K 7/20* (2006.01)

(52) U.S. Cl.
CPC ....... *H05K 7/1488* (2013.01); *H05K 7/20172* (2013.01)

(58) Field of Classification Search
CPC .... F04D 29/60–646; G06F 1/18; G06F 1/181; G06F 1/183–188; G06F 1/20; G06F 1/203; G06F 1/206; G06F 13/409; H05K 7/20554–20581; H05K 7/1489; H05K 7/1401; H05K 7/1409; H05K 7/20; H05K 7/20009; H05K 7/20136; H05K 7/20145; H05K 7/20172; H05K 7/2019; H05K 7/202; H05K 7/1488; H05K 7/20736; H05K 13/0486; H05K 2203/176; H05K 2203/306; H05K 5/0221; H05K 5/023; F16H 2019/0668
See application file for complete search history.

(56) References Cited

U.S. PATENT DOCUMENTS

| | | | | |
|---|---|---|---|---|
| 79,130 | A * | 6/1868 | Keck | A01D 90/10 254/312 |
| 5,774,384 | A * | 6/1998 | Okaya | G06F 1/1664 345/169 |

(Continued)

FOREIGN PATENT DOCUMENTS

| | | | | |
|---|---|---|---|---|
| CN | 101532511 A | * | 9/2009 | ........... F04D 29/601 |
| CN | 111820598 A | * | 10/2020 | ........... F04D 29/601 |

*Primary Examiner* — Topaz L. Elliott
(74) *Attorney, Agent, or Firm* — Jackson Walker L.L.P.

(57) ABSTRACT

An information handling system may include a chassis, a bay within the chassis for receiving a modular information handling resource, and a pulley assembly within the chassis and adjacent to the bay, the pulley assembly comprising a handle mechanically rotatable between a closed position and an open position, a pulley subsystem comprising a pulley cable mechanically coupled to the handle, and a carrier mechanically coupled to the pulley subsystem and configured such that the modular information handling resource rests on the carrier when the modular information handling resource is installed in the information handling system. The pulley assembly may be arranged such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

12 Claims, 8 Drawing Sheets

(56) References Cited

U.S. PATENT DOCUMENTS

| | | | | |
|---|---|---|---|---|
| 6,574,097 B2* | 6/2003 | Hood, III | ............... | G06F 1/1616 |
| | | | | 248/581 |
| 7,123,485 B1* | 10/2006 | Henderson | ........... | H05K 7/1457 |
| | | | | 211/209 |
| 10,863,647 B1* | 12/2020 | Escamilla | ............... | H05K 5/023 |
| 2003/0026071 A1* | 2/2003 | Hood, III | ............... | G06F 1/1635 |
| | | | | 361/679.58 |
| 2003/0109165 A1* | 6/2003 | Castleman | ........... | H05K 7/1424 |
| | | | | 439/352 |
| 2012/0127658 A1* | 5/2012 | Hartman | ................. | G06F 1/187 |
| | | | | 29/428 |
| 2013/0248297 A1* | 9/2013 | Manes | ................. | G11B 17/225 |
| | | | | 187/254 |
| 2014/0199141 A1* | 7/2014 | Bolde | ..................... | B66F 9/141 |
| | | | | 414/807 |
| 2016/0064040 A1* | 3/2016 | Hartman | ............... | H05K 7/1402 |
| | | | | 360/97.12 |
| 2016/0121156 A1* | 5/2016 | Bach | ................. | A63B 21/0087 |
| | | | | 482/112 |
| 2020/0315070 A1* | 10/2020 | Holland | ................ | F04D 25/166 |

\* cited by examiner

SYSTEMS AND METHODS FOR REMOVING MODULES FROM AN INFORMATION HANDLING SYSTEM

TECHNICAL FIELD

The present disclosure relates in general to information handling systems, and more particularly to mounting a sleeve in the cable channel of an information handling system to cause a fluidic seal between the cable channel and the exterior of a chassis of the information handling system, while including sealable openings for passage of cables.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems include removable modules for holding information handling system components. For example, some information handling systems may include a removable air mover gantry for holding a plurality of air movers (e.g., fans or blowers) for cooling the information handling system. As another example, some information handling systems may include a removable hard drive carrier for holding a plurality of hard drives.

A disadvantage of many information handling systems with removable modules is that such modules may be particularly heavy, especially when populated with devices, and due to space concerns, may not be able to provide a user with sufficient handles or other features to allow a user to effectively gain sufficient grip to physically remove the module.

SUMMARY

In accordance with the teachings of the present disclosure, the disadvantages and problems associated traditional approaches to mounting air movers in an information handling system may be substantially reduced or eliminated.

In accordance with embodiments of the present disclosure, an information handling system may include a chassis, a bay within the chassis for receiving a modular information handling resource, and a pulley assembly within the chassis and adjacent to the bay, the pulley assembly comprising a handle mechanically rotatable between a closed position and an open position, a pulley subsystem comprising a pulley cable mechanically coupled to the handle, and a carrier mechanically coupled to the pulley subsystem and configured such that the modular information handling resource rests on the carrier when the modular information handling resource is installed in the information handling system. The pulley assembly may be arranged such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

In accordance with these and other embodiments of the present disclosure, a pulley assembly configured to couple to a chassis of an information handling system adjacent to a bay within the chassis for receiving a modular information handling resource may be provided. The pulley assembly may include a handle mechanically rotatable between a closed position and an open position, a pulley subsystem comprising a pulley cable mechanically coupled to the handle, and a carrier mechanically coupled to the pulley subsystem and configured such that the modular information handling resource rests on the carrier when the modular information handling resource is installed in the information handling system. The pulley assembly may be arranged such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

In accordance with these and other embodiments of the present disclosure, a method for constructing a pulley assembly configured to couple to a chassis of an information handling system adjacent to a bay within the chassis for receiving a modular information handling resource may be provided. The method may include rotatably coupling a handle to the pulley assembly rotatable between a closed position and an open position, mechanically coupling a pulley subsystem comprising a pulley cable to the handle, mechanically coupling a carrier to the pulley subsystem and configured such that the modular information handling resource rests on the carrier when the modular information handling resource is installed in the information handling system, and arranging the pulley assembly such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1:
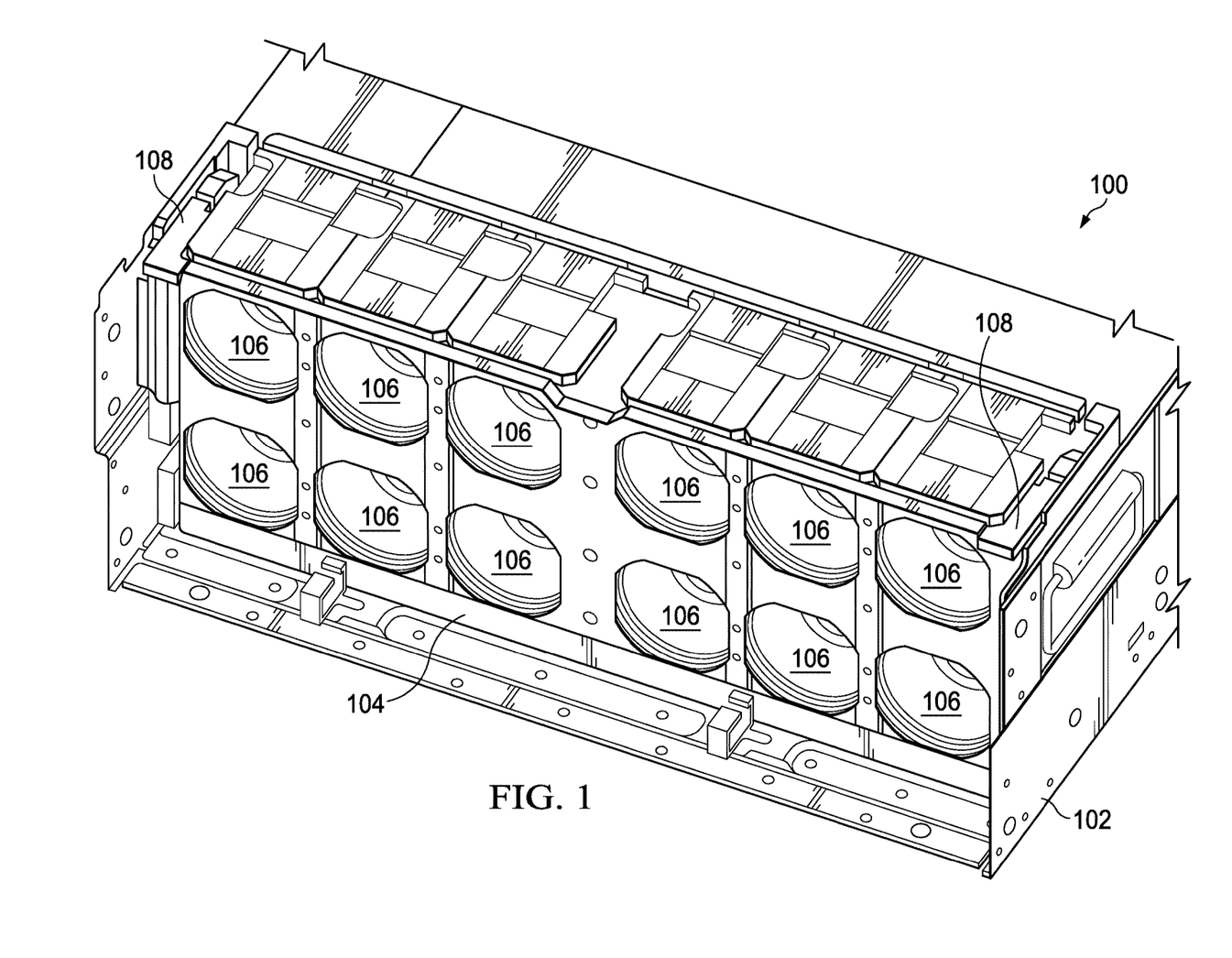
FIG. 1 illustrates an isometric view of selected components of an example information handling system, in accordance with the present disclosure.

FIG. 1 illustrates an isometric view of selected components of an example information handling system 100, in accordance with the present disclosure. In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having a gantry 104 configured to house a plurality of air movers 106, and a pair of pulley assemblies 108 configured to assist a user in insertion and removal of gantry 104, as described in greater detail below.

Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Gantry 104 may comprise any suitable system, device, or apparatus configured to house the plurality of air movers 106, and may comprise a modular component which may be readily inserted into and removed from a corresponding portion of chassis 102 (e.g., a bay). In some embodiments, gantry 104 may serve as a mechanical guiding mechanism in order that air movers 106 housed in gantry 104 may be appropriately guided to electrically interface with corresponding electrical connectors within chassis 102.

Each air mover 106 may be any mechanical or electro-mechanical system, apparatus, or device operable to move air and/or other gases. In certain embodiments, air movers 106 may draw cool air into chassis 102 from the outside, expel warm air from inside chassis 102, and/or move air across one or more heatsinks (not explicitly shown) internal to chassis 102 to cool one or more information handling resources of information handling system 100.

Each pulley assembly 108 may be mechanically coupled to chassis 102 and may comprise a pulley and other mechanical features to assist a user (e.g., administrator or technician) in inserting gantry 104 into chassis 102 and/or removing gantry 104 from chassis 102, as described in greater detail below.

Figure 2A:
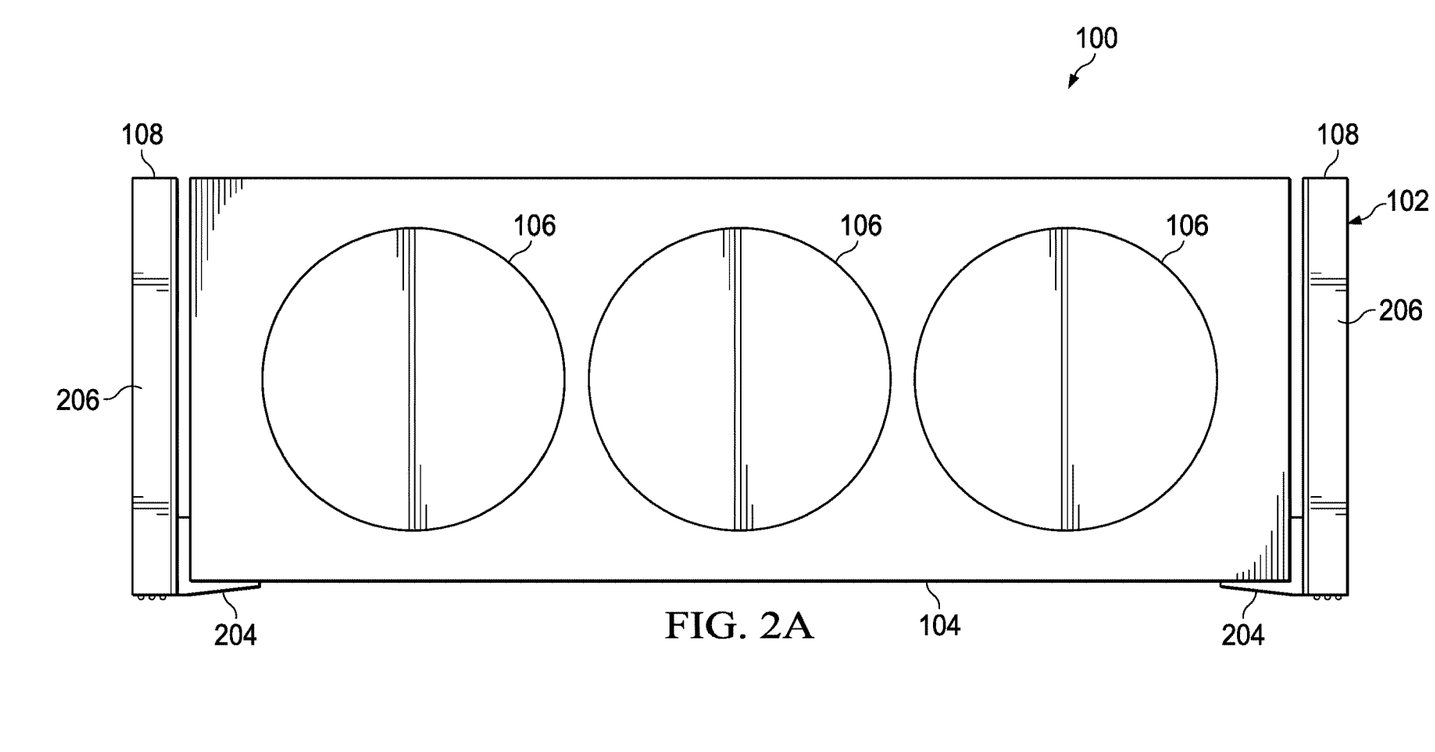
FIG. 2A illustrates an elevation view of an information handling system with a gantry fully inserted into a chassis, in accordance with embodiments of the present disclosure.
Figure 2B:
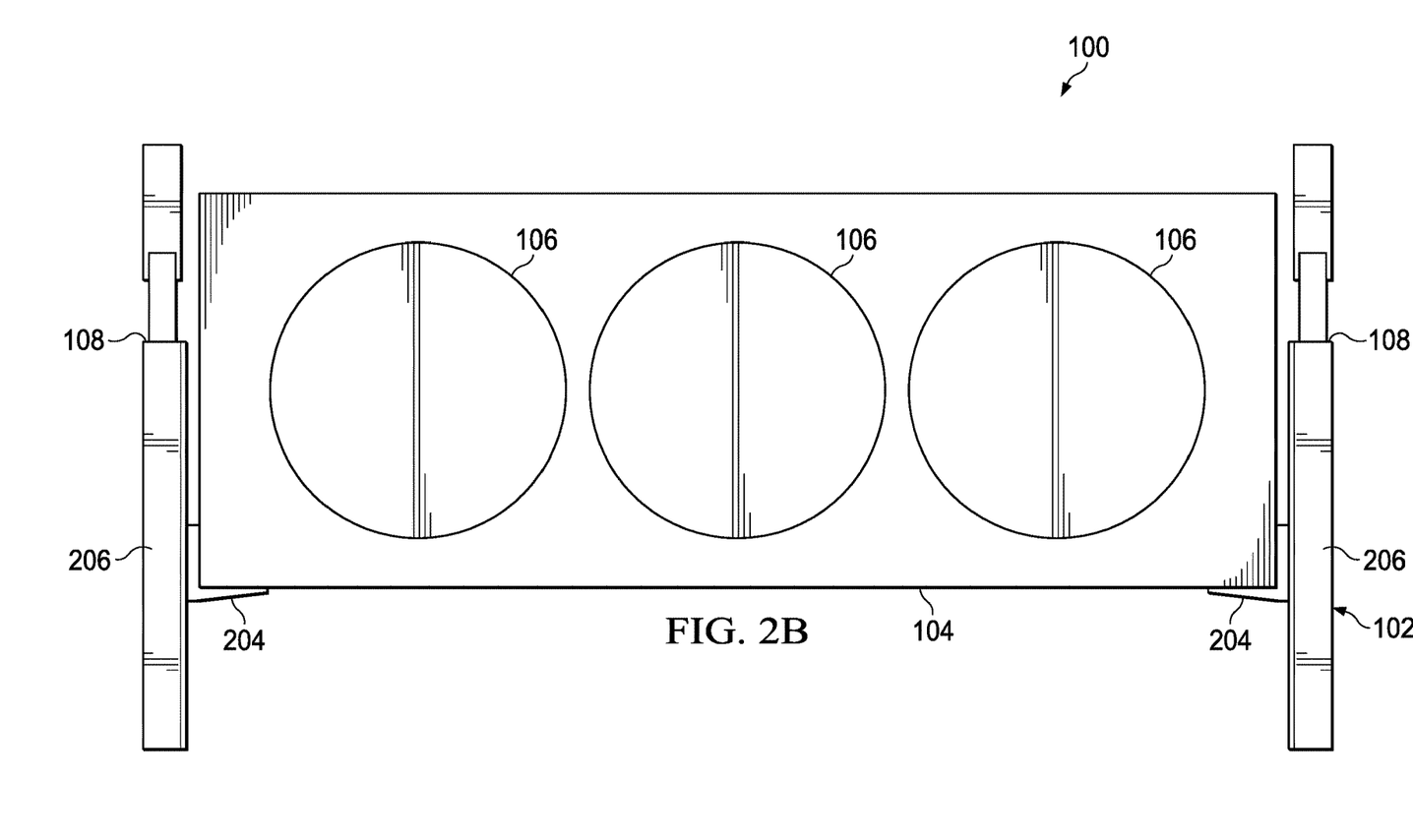
FIG. 2B illustrates an elevation view of an information handling system with a gantry partially removed from a chassis, in accordance with embodiments of the present disclosure.
Figure 3A:
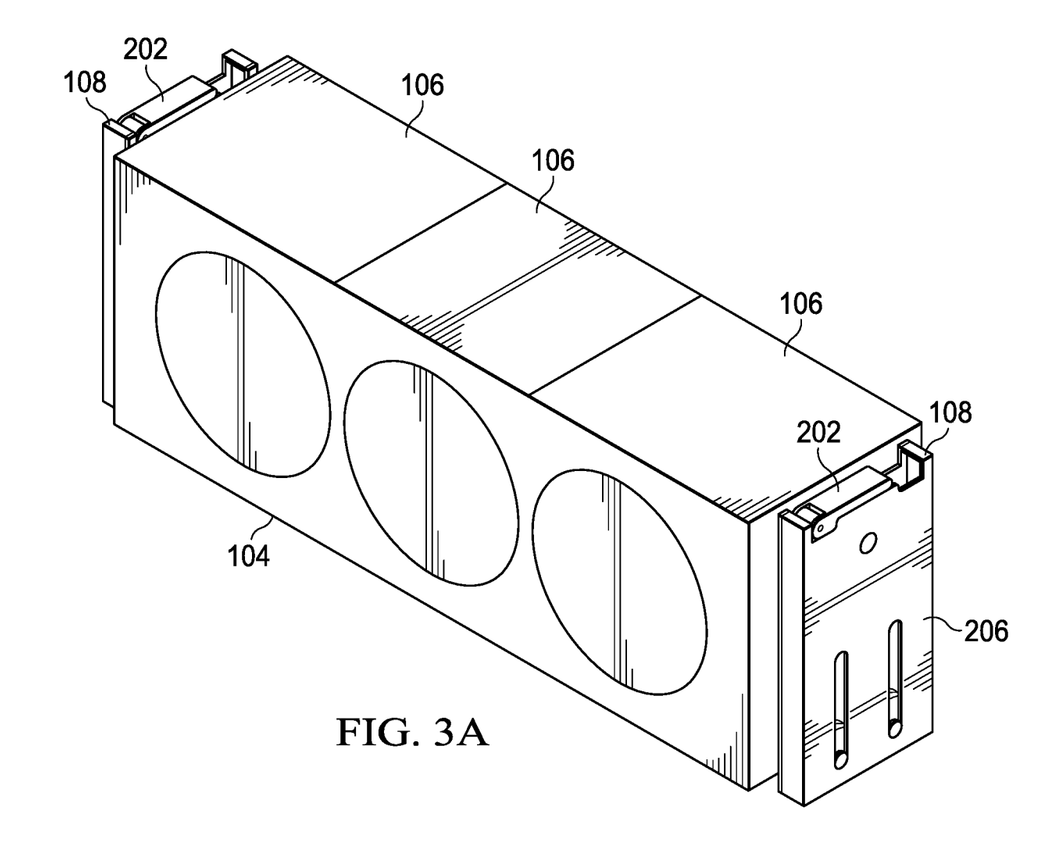
FIG. 3A illustrates an isometric view of an information handling system with a gantry fully inserted into a chassis, in accordance with embodiments of the present disclosure.
Figure 3B:
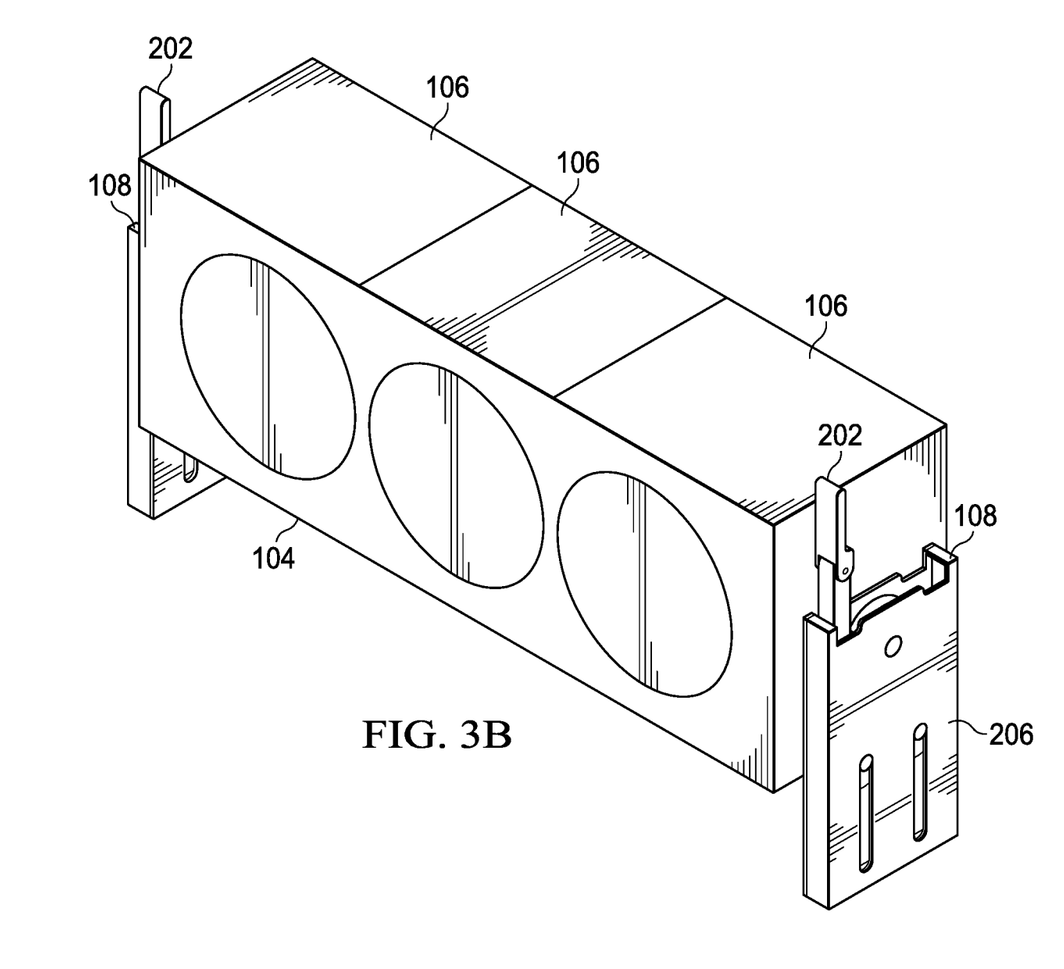
FIG. 3B illustrates an isometric view of an information handling system with a gantry partially removed from a chassis, in accordance with embodiments of the present disclosure.

Operation of pulley assembly 108 is depicted in FIGS. 2A, 2B, 3A, and 3B. FIG. 2A illustrates an elevation view of information handling system 100 with gantry 104 fully inserted into chassis 102, in accordance with embodiments of the present disclosure. FIG. 2B illustrates an elevation view of information handling system 100 with gantry 104 partially removed from chassis 102, in accordance with embodiments of the present disclosure. FIG. 3A illustrates an isometric view of information handling system 100 with gantry 104 fully inserted into chassis 102, in accordance with embodiments of the present disclosure. FIG. 3B illustrates an isometric view of information handling system 100 with gantry 104 partially removed from chassis 102, in accordance with embodiments of the present disclosure.

As shown in FIGS. 2A, 2B, 3A, and 3B, each pulley assembly 108 may include a body 206, a handle 202 rotatably coupled to body 206, and a carrier 204 movably coupled to body 206 in an axis of motion. Handle 202 may in some instances be part of a mechanical latching mechanism that mechanically latches components of pulley assembly 108 in place when gantry 104 is fully inserted into chassis 102. Each carrier 204 may include a ledge or shelf upon which a portion of gantry 104 may rest.

To remove gantry 104 from chassis 102, a user may rotate handles 202 from the closed position shown in FIGS. 2A and 3A to the open position shown in FIGS. 2B and 3B, grasp handles 202, and lift upwards (e.g., in a desired direction of motion), causing carriers 204 to rise, thus lifting gantry 104 in an upwards direction and providing user access to gantry 104.

Figure 4:
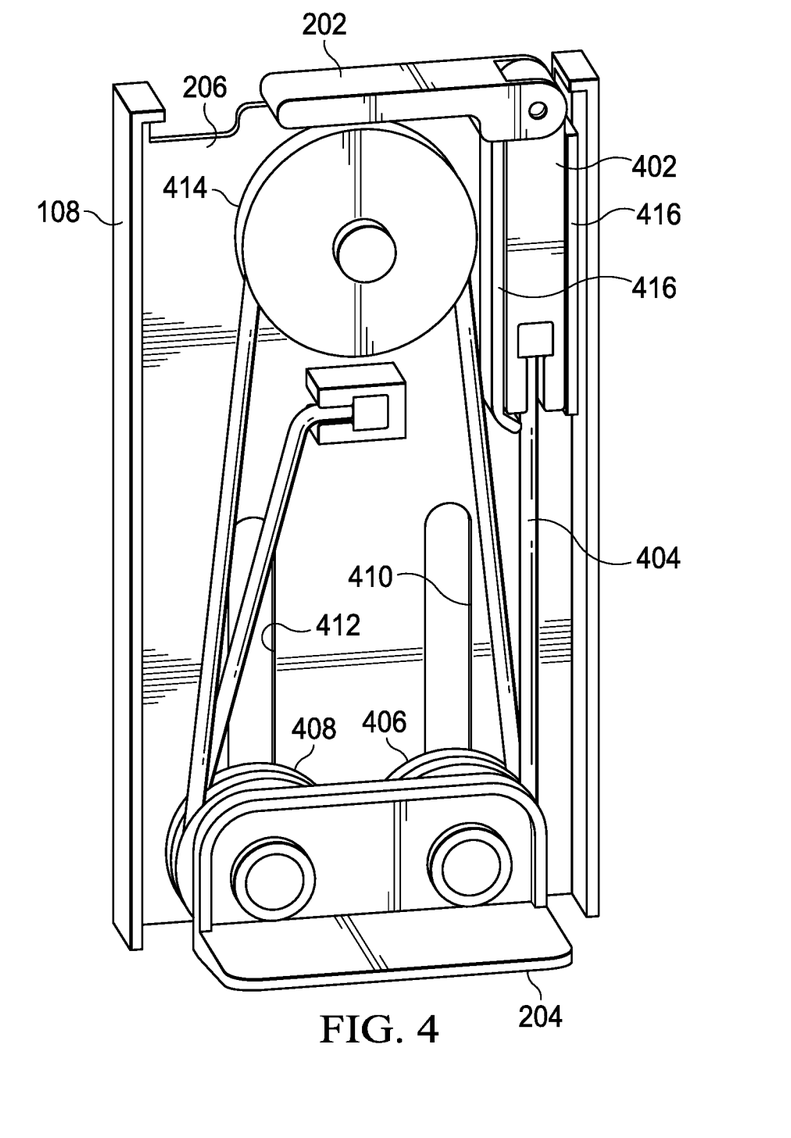
FIG. 4 illustrates an isometric view of a pulley assembly, in accordance with embodiments of the present disclosure.

FIG. 4 illustrates an isometric view of a pulley assembly 108, in accordance with embodiments of the present disclosure. As shown in FIG. 4, pulley assembly 108 may include body 206, handle 202, pull bar 402 to which handle 202 is rotatably coupled wherein motion of pull bar 402 is constrained linear motion on one axis by guiding features 416, pulley cable 404 coupled to pull bar 402 and body 206 as shown, pulley wheel 406 slidably coupled to body 206 via an opening 410 in body 206, pulley wheel 408 slidably coupled to body 206 via an opening 412 in body 206, a pulley wheel 414 coupled at a fixed location of body 206, and carrier 204 mechanically coupled to pulley wheels 406 and 408.

As shown in FIG. 4, opening 410 and opening 412 may respectively constrain pulley wheel 406 and pulley wheel 408 in a linear axis as to limit the range of motion of pulley wheel 406 and pulley wheel 408 relative to body 206 within such linear axis.

Further as shown in FIG. 4, pulley cable 404 may run via respective first grooves in each of pulley wheel 406 and pulley wheel 408, via a groove in pulley wheel 410, and then through respective second grooves in each of pulley wheel 406 and pulley wheel 408 before being terminated proximate to pulley wheel 410 at a point to which pulley cable 404 is fixedly coupled to body 206.

Figure 5A:
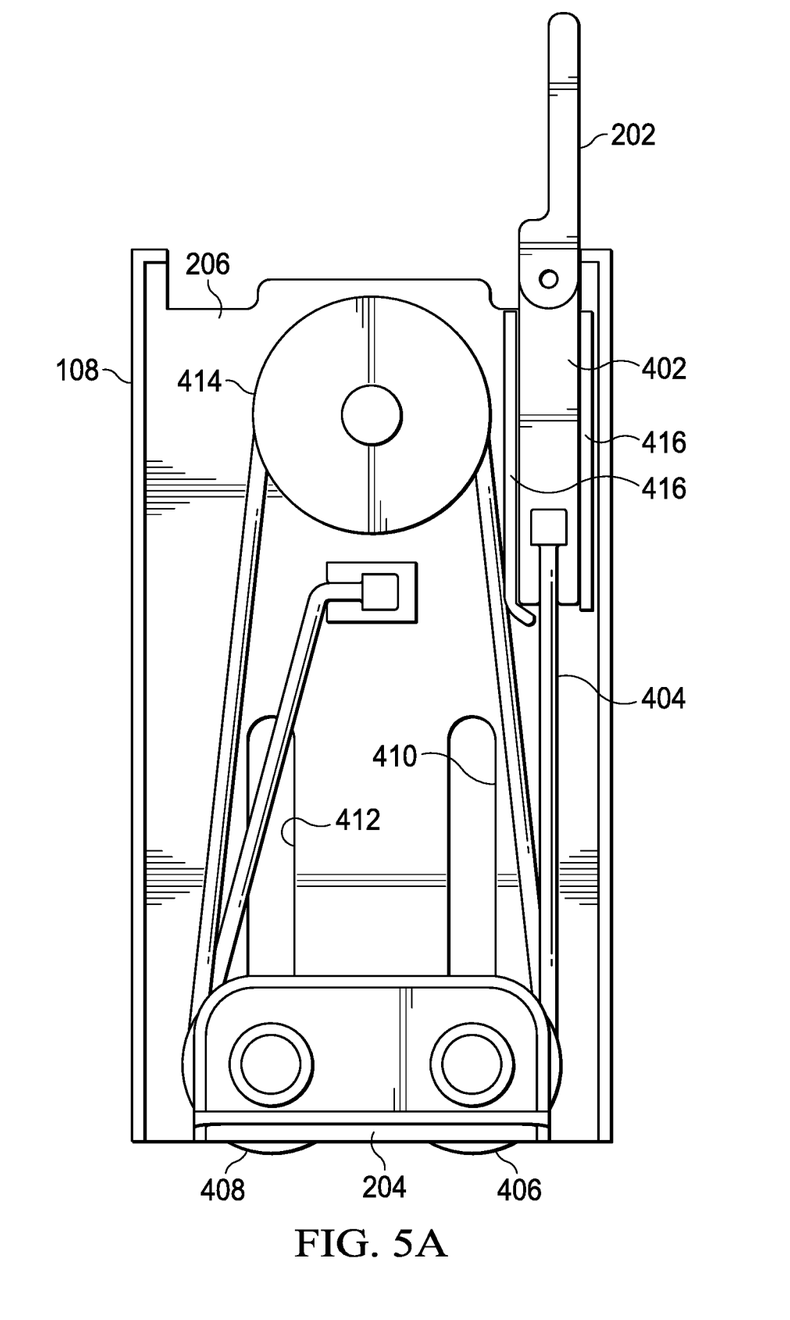
FIGS. 5A and 5B illustrates isometric views of the pulley assembly shown in FIG. 4 depicting removal of a gantry, in accordance with embodiments of the present disclosure.
Figure 5B:
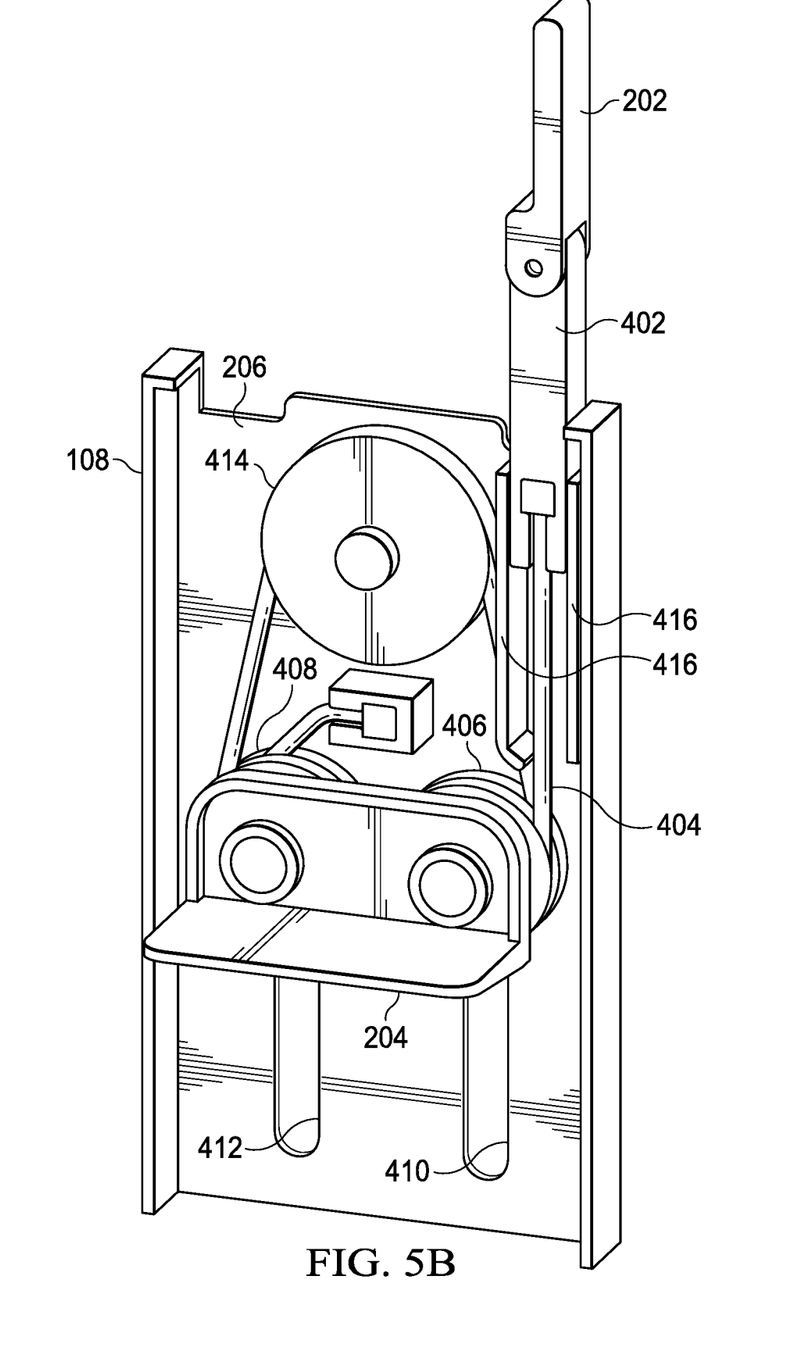

Accordingly, to remove gantry 104 from chassis 102, a user may rotate handles 202 of each pulley assembly 108 from the closed position shown in FIG. 4 to the open position shown in FIG. 5A. After handles 202 are in the open position, the user may grasp handles 202, and lift upwards (e.g., in a desired direction of motion) as shown in FIG. 5B. Such grasping and lifting of a handle 202 may cause a corresponding upward motion of pull bar 402, in turn causing the end of pulley cable 404 coupled to pull bar 402 to move in a corresponding upward motion. Such motion of pulley cable 404 may cause pulley wheel 406 and pulley wheel 408 to move linearly upwards within openings 410 and 412 respectively, with the maximum linear movement of pulley wheel 406 and pulley wheel 408 limited by openings 410 and 412, respectively. Such motion of pulley wheel 406 and pulley wheel 408 may in turn cause corresponding upward motion of carrier 204, thus similarly lifting gantry 104 upward.

In some embodiments, pull bar 402 and body 206 may include mechanical features that may maintain pull bar 402 at or near its maximum height relative to body 206 once translated to such position, allowing gantry 104 to remain in a removed position without the need for a user to maintain force on handles 202. Such mechanical features of pull bar 402 and body 206 may also allow the user to disengage such engagement of pull bar 402 and body 206 to allow downward motion of pull bar 402 relative to body 206.

As those of ordinary skill in the art may recognize, pulley assembly 108 as shown and described may provide a fourfold mechanical advantage in removing gantry 104. In other words, the force needed to remove gantry 104 using pulley assembly 108 may be approximately one-fourth of the combined weight of gantry 104 and the moveable components of pulley assembly 108.

To insert gantry 104 into chassis 102, a user may reverse the steps listed above to gently lower gantry 104 back into chassis 102. In some embodiments, pulley wheel 414 may include a buffer, reducer, and/or other mechanical feature that limits a rate at which pulley wheel 406 and pulley wheel 408 may lower relative to body 206.

While the foregoing contemplates the use of pulley assembly 108 for removal and insertion of gantry 104, it is understood that systems and methods identical or similar to those disclosed above may be used to aid insertion and/or removal of other modular components, including without limitation hard drive carriers, combination processor and memory modules, graphics processing unit riser cages, or other modular components.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a chassis;
   a bay within the chassis for receiving a modular information handling resource; and
   a pulley assembly within the chassis and adjacent to the bay, the pulley assembly comprising:
      a handle mechanically rotatable between a closed position and an open position;
      a pulley subsystem comprising a pulley cable mechanically coupled to the handle;
      a carrier mechanically coupled to the pulley subsystem and configured such that the modular information handling resource rests on the carrier when the modular information handling resource is installed in the information handling system;
      a body;
      a first pulley wheel slidably coupled to the body and constrained to move in a linear axis relative to the body;
      a second pulley wheel slidably coupled to the body and constrained to move in a second linear axis parallel to the first linear axis; and
      a third pulley wheel coupled at a fixed position relative to the body and proximate to the handle when the information handling resource is fully inserted into the bay;
      wherein:
         the pulley cable engages with each of the first pulley wheel, second pulley wheel, and third pulley wheel;
         the carrier is fixedly coupled to the first pulley wheel and the second pulley wheel; and
         the pulley assembly is arranged such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

2. The information handling system of claim 1, wherein the mechanical advantage is a four-fold mechanical advantage.

3. The information handling system of claim 1, wherein the pulley cable runs via respective first grooves in each of the first pulley wheel and the second pulley wheel, via a groove in the third pulley wheel, and then through respective second grooves in each of the first pulley wheel and the second pulley wheel before being terminated between the third pulley wheel and the first and second pulley wheels at a point to which the pulley cable is fixedly coupled to the body.

4. The information handling system of claim 1, wherein application of the force causes the first pulley wheel and the second pulley wheel to move relative to the body.

5. A pulley assembly configured to couple to a chassis of an information handling system adjacent to a bay within the chassis for receiving a modular information handling resource, the pulley assembly comprising:
   a handle mechanically rotatable between a closed position and an open position;
   a pulley subsystem comprising a pulley cable mechanically coupled to the handle;
   a carrier mechanically coupled to the pulley subsystem and configured such that the modular information handling resource rests on the carrier when the modular information handling resource is installed in the information handling system;
   a body;
   a first pulley wheel slidably coupled to the body and constrained to move in a linear axis relative to the body;
   a second pulley wheel slidably coupled to the body and constrained to move in a second linear axis parallel to the first linear axis; and
   a third pulley wheel coupled at a fixed position relative to the body and proximate to the handle when the information handling resource is fully inserted into the bay;
   wherein:
      the pulley cable engages with each of the first pulley wheel, second pulley wheel, and third pulley wheel;
      the carrier is fixedly coupled to the first pulley wheel and the second pulley wheel; and
      the pulley assembly is arranged such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

6. The pulley assembly of claim 5, wherein the mechanical advantage is a four-fold mechanical advantage.

7. The pulley assembly of claim 5, wherein the pulley cable runs via respective first grooves in each of the first pulley wheel and the second pulley wheel, via a groove in the third pulley wheel, and then through respective second grooves in each of the first pulley wheel and the second pulley wheel before being terminated between the third pulley wheel and the first and second pulley wheels at a point to which the pulley cable is fixedly coupled to the body.

8. The pulley assembly of claim 5, wherein application of the force causes the first pulley wheel and the second pulley wheel to move relative to the body.

9. A method for constructing a pulley assembly configured to couple to a chassis of an information handling system adjacent to a bay within the chassis for receiving a modular information handling resource, the method comprising:
   rotatably coupling a handle to the pulley assembly rotatable between a closed position and an open position;
   mechanically coupling a pulley subsystem comprising a pulley cable to the handle;
   mechanically coupling a carrier to the pulley subsystem and configured such that the modular information handling resource rests on the carrier when the modular information handling resource is installed in the information handling system;
   slidably coupling a body to a first pulley wheel constrained to move in a linear axis relative to the body;
   slidably coupling a second pulley wheel to the body proximate to the first pulley wheel and constrained to move in a second linear axis parallel to the first linear axis;

coupling at a fixed position relative to the body a third pulley wheel when the information handling resource is fully inserted into the bay;

fixedly coupling the carrier to the first pulley wheel and the second pulley wheel; and arranging the pulley assembly such that the pulley cable engages with each of the first pulley wheel, second pulley wheel, and third pulley wheel; and arranging the pulley assembly such that force applied to the handle when the handle is in the open position provides a mechanical advantage via the pulley subsystem to mechanically translate the carrier in accordance with the force and the mechanical advantage to cause at least partial removal of the modular information handling resource from the bay in response to the force.

10. The method of claim 9, wherein the mechanical advantage is a four-fold mechanical advantage.

11. The method of claim 9, further comprising arranging the pulley cable such that the pulley cable runs via respective first grooves in each of the first pulley wheel and the second pulley wheel, via a groove in the third pulley wheel, and then through respective second grooves in each of the first pulley wheel and the second pulley wheel before being terminated between the third pulley wheel and the first and second pulley wheels at a point to which the pulley cable is fixedly coupled to the body.

12. The method of claim 9, wherein application of the force causes the first pulley wheel and the second pulley wheel to move relative to the body.

* * * * *